(12) United States Patent
Pass (10) Patent No.: US 8,975,175 B1
(45) Date of Patent: Mar. 10, 2015

(54) SOLDERABLE CONTACT REGIONS

(71) Applicant: SunPower Corporation, San Jose, CA (US)

(72) Inventor: Thomas Pass, San Jose, CA (US)

(73) Assignee: SunPower Corporation, San Jose, CA (US)

(*) Notice: Subject to any disclaimer, the term of this patent is extended or adjusted under 35 U.S.C. 154(b) by 0 days.

(21) Appl. No.: 13/930,668

(22) Filed: Jun. 28, 2013

(51) Int. Cl.
| | | |
|---|---|---|
| H01L 21/44 | (2006.01) | |
| H01L 21/322 | (2006.01) | |
| H01L 21/265 | (2006.01) | |
| H01L 21/8238 | (2006.01) | |
| H01L 23/48 | (2006.01) | |
| H01L 23/52 | (2006.01) | |
| H01L 29/40 | (2006.01) | |
| H01L 23/00 | (2006.01) | |

(52) U.S. Cl.
CPC ...................................... H01L 24/03 (2013.01)
USPC ........... 438/612; 438/476; 438/523; 438/233; 257/772; 257/779; 257/E23.023

(58) Field of Classification Search
USPC ........... 438/612, 98, 233, 523, 533, 571, 586, 438/597, 476, 620; 257/772, 779, E23.023
See application file for complete search history.

(56) References Cited

U.S. PATENT DOCUMENTS

| | | | | |
|---|---|---|---|---|
| 5,356,488 | A * | 10/1994 | Hezel | 136/256 |
| 6,426,021 | B2 * | 7/2002 | Suga et al. | 252/513 |
| 7,009,297 | B1 * | 3/2006 | Chiang et al. | 257/738 |
| 7,091,589 | B2 * | 8/2006 | Mori et al. | 257/686 |
| 7,858,440 | B2 * | 12/2010 | Pressel et al. | 438/109 |
| 7,867,863 | B2 * | 1/2011 | Chang | 438/299 |
| 7,867,900 | B2 * | 1/2011 | Lee et al. | 438/655 |
| 7,992,291 | B2 * | 8/2011 | Jung et al. | 29/831 |

* cited by examiner

*Primary Examiner* — Evan Pert
*Assistant Examiner* — Gustavo Ramallo
(74) *Attorney, Agent, or Firm* — Okamoto & Benedicto LLP (57) ABSTRACT

A contact region for a semiconductor substrate is disclosed. Embodiments can include forming a seed metal layer having an exposed solder pad region on the semiconductor substrate and forming a first metal layer on the seed metal layer. In an embodiment, a solderable material, such as silver, can be formed on the exposed solder pad region prior to forming the first metal layer. Embodiments can include forming a solderable material on the exposed solder pad region after forming the first metal layer. Embodiments can also include forming a plating contact region on the seed metal layer, where the plating contact region allows for electrical conduction during a plating process.

18 Claims, 12 Drawing Sheets

SOLDERABLE CONTACT REGIONS

TECHNICAL FIELD

Embodiments of the subject matter described herein relate generally to semiconductor devices including solar cells. More particularly, embodiments of the subject matter relate to solar cell structures and fabrication processes.

BACKGROUND

Semiconductors are widely used in most of electronic devices today. Some examples of semiconductor devices or structures are diodes, light emitting diodes and solar cells. Solar cells, for example, are well known devices for converting solar radiation to electrical energy. They can be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact regions and contact fingers allow an external electrical circuit to be coupled to and be powered by the solar cell.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

BRIEF SUMMARY

A method for forming a contact region for a semiconductor device is disclosed. The method can include forming a seed metal layer including an exposed solder pad region on the semiconductor substrate. The method can also include forming a first metal layer on the seed metal layer. In an embodiment, the method can include forming a solderable material on the exposed solder pad region prior to forming the first metal layer. Embodiments also include forming a solderable material on the exposed solder pad region subsequent to forming the first metal layer. In some embodiments, the method can include forming a contact region for a silicon substrate of a solar cell.

Another method for forming a contact region for a semiconductor device is disclosed. The method can include forming a seed metal layer having an exposed solder pad region on the silicon substrate. The method can also include forming a solderable material on the exposed solder pad region of the seed metal layer and plating a first metal layer on the seed metal layer.

Still another method for forming a contact region for a semiconductor device is disclosed. The method can include forming a seed metal layer including an exposed solder pad region on the silicon substrate and plating a first metal layer on the seed metal layer. The method can also include subsequently forming a solderable material on the exposed solder pad region of the seed metal layer.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Figure 1:
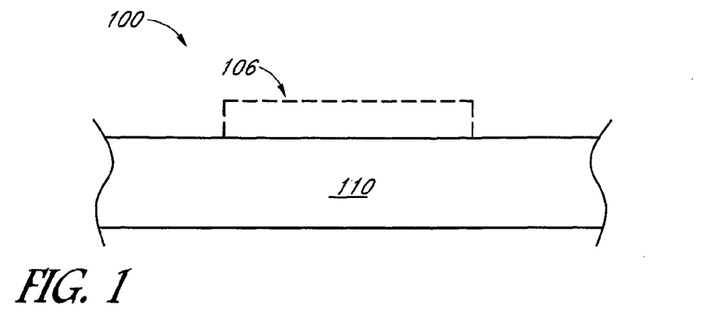
FIGS. 1-4 are cross-sectional representations of a semiconductor device in accordance with a contact formation technique.
Figure 2:
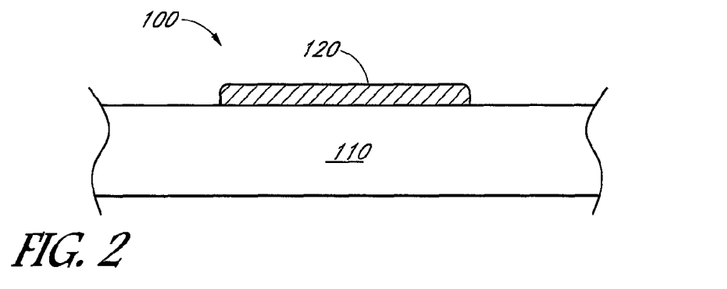
Figure 3:
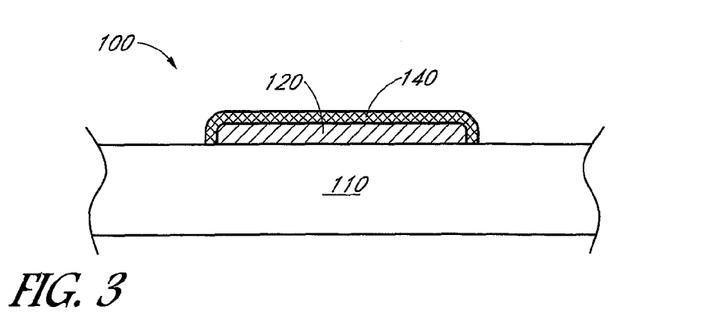
Figure 4:
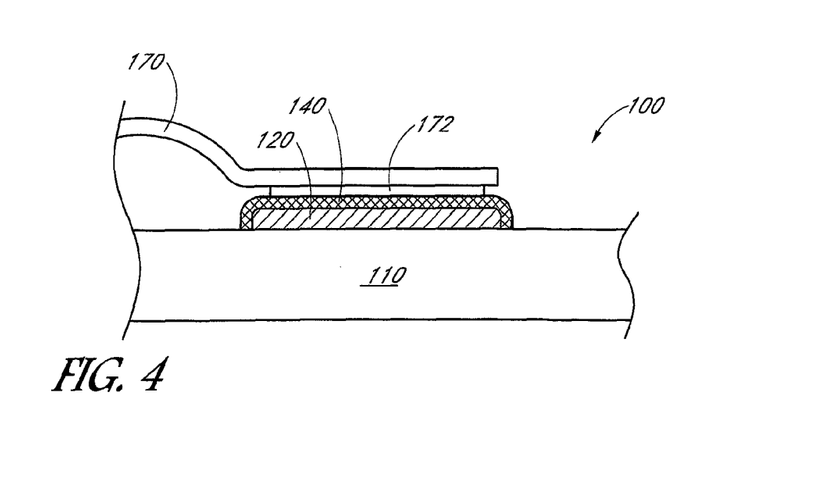

FIGS. 1-4 illustrate operations in a technique for forming a contact region for a semiconductor device. The semiconductor device 100 can be any common semiconductor device such as a diode, a light emitting diode or solar cell. Referring to FIG. 1, the semiconductor device 100 can include a semiconductor substrate 110. The semiconductor substrate 110 can include a silicon substrate. The technique can include forming a seed metal layer 120 on a solder pad region 106 of the semiconductor substrate 110 as shown in FIGS. 1 and 2. A technique for forming the seed metal layer can include physical vapor deposition (PVD) and annealing. The semiconductor substrate 110 can also include doped regions and a dielectric layer on the doped regions, where the seed metal layer is electrically coupled to the doped regions through the dielectric layer. FIG. 3 illustrates forming a first metal layer 140 on the seed metal layer 120. A plating technique can be used to form the first metal layer 140 on the seed metal layer 120. Subsequently solder paste 172 can be applied on the first metal layer 140 and a soldering process can be performed to electrically connect an interconnect tab 170 to the semiconductor device 100, allowing for electrical conduction between an external circuit and the semiconductor device 100 as seen in FIG. 4.

Figure 5:
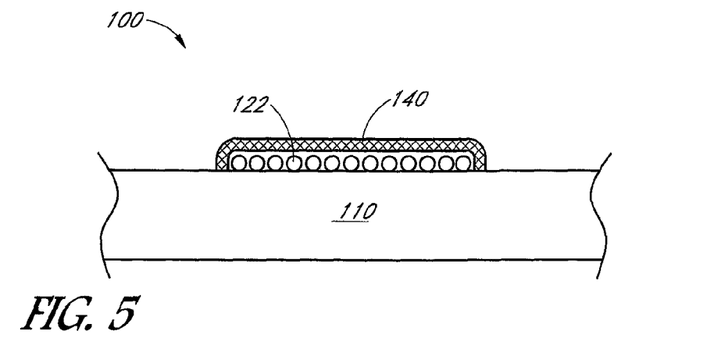
FIGS. 5-7 are cross-sectional representations of a semiconductor device in accordance with another contact formation technique.
Figure 6:
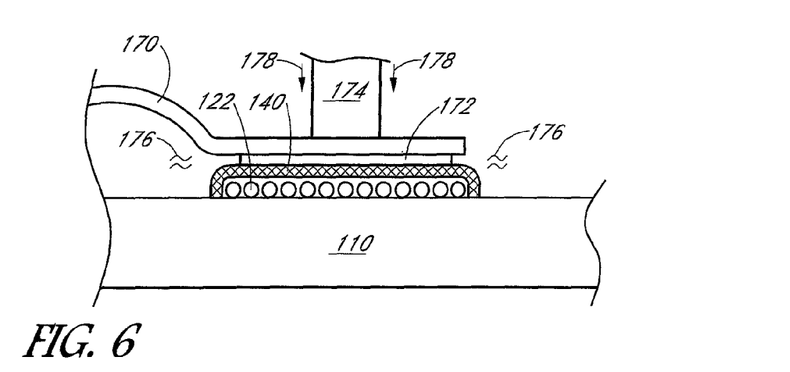
Figure 7:
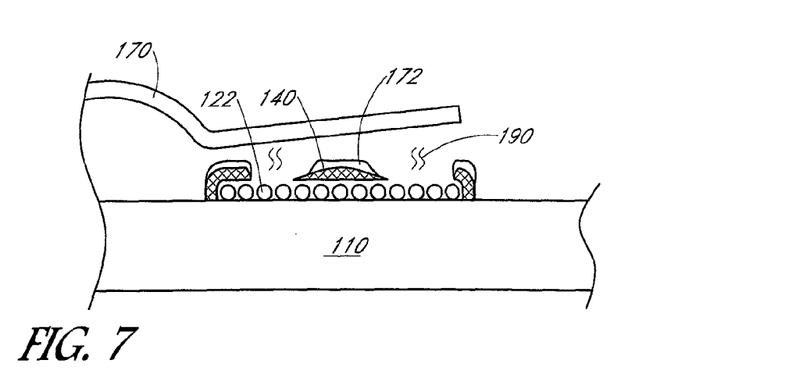

With reference to FIGS. 5-7, another technique for forming a contact region for a semiconductor device is shown. In reducing the cost of producing a semiconductor device 100 it is advantageous to form the seed metal layer using a printed metal deposition instead of PVD, where the seed metal layer is composed of a plurality metal particles 122. The technique can include forming a first metal layer 140 on the seed metal layer 122 as shown in FIG. 5. FIG. 6 shows a soldering process can be performed, after forming the first metal layer 140, where a soldering head 174 holds down 178 on the interconnect tab 170 and applies heat 176 through the interconnect tab 170 to heat the solder paste 172. Using a seed metal layer 122 composed of metal particles, however, may have its disadvantages. Because the seed metal layer is composed of a plurality of metal particles 122, moisture can be trapped within the seed metal layer between metal particles 122. Thus, heat 190 from the soldering process can cause spitting and delamination at solder pad regions, as shown in FIG. 7.

To address the above difficulties, some embodiments involve the use of applying a solderable material, in place of the seed metal layer, on regions only where a soldering process will be performed. The seed metal layer can be formed over all other regions of the semiconductor substrate. This and other solutions including similar embodiments are discussed in detail below.

FIGS. 8-11 illustrate a method for forming a contact region for a semiconductor device. In an embodiment, the semiconductor device 200 can include a semiconductor substrate 210. The method of FIGS. 8-11 can include forming a seed metal layer on the semiconductor substrate 210. In some embodiments, the seed metal layer can be formed by a print deposition method, such as screen printing. Embodiments can also include a seed metal layer composed of a layer of paste, the layer of paste having metal particles 222 and a filler medium 224.

Figure 8:
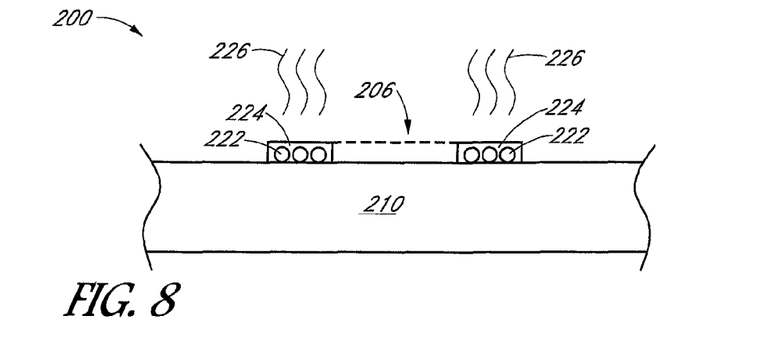
FIGS. 8-11 are cross-sectional representations of a semiconductor device being fabricated in accordance with a presented method for forming a contact region on a semiconductor device.

With reference to FIG. 8, a thermal cure process performed on the seed metal layer disposed on the semiconductor substrate is shown. The metal particles 222 and filler medium 224 can be formed over the semiconductor substrate 210, where a thermal cure 226 is performed on the seed metal layer composed metal particles 222 and filler medium 224. In an embodiment, the thermal cure 226 provides additional adhesion between the semiconductor substrate 210 and the seed metal layer. Embodiments can also include metal particles selected from the group composed of aluminum micro-particles and aluminum nano-particles. In some embodiments, the seed metal layer can be composed of a material selected from the group composed of aluminum, aluminum paste or any applicable metal commonly used for coupling metal layers to doped regions of semiconductor devices. Embodiments can also include evaporating most of the filler medium 224 during thermal curing 226. FIG. 8 shows the method can also include an exposed solder pad region 206.

Figure 9:
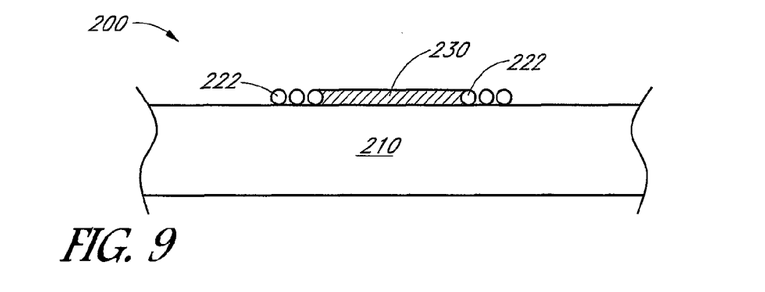

FIG. 9 illustrates forming a solderable material on the exposed solder pad region. The method can include forming a solderable material 230 on the exposed solder pad region 206 of FIG. 8 after forming and curing the seed metal layer. In an embodiment, the solderable material 230 can be formed prior to curing. Embodiments can include curing the solderable material during the curing process of the seed metal layer. In an embodiment, the solderable material is composed of a layer of silver paste. Embodiments can also include the solderable material 230 having a thickness, measured from the semiconductor substrate 200, in the range of 1-10 microns.

Figure 10:
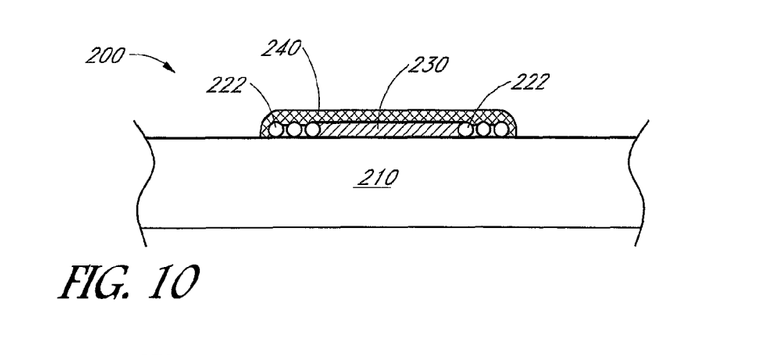

With reference to FIG. 10, forming a first metal layer on the seed metal layer is shown. In an embodiment, the method can include plating a first metal layer 240 on the seed metal layer and the solderable material 230. Embodiments can include electroless or electrolytic plating processes. In an embodiment, plating the first metal layer 240 can include plating metals selected from the group composed of copper, tin, aluminum, silver, gold, chromium, iron, nickel, zinc, ruthenium, palladium, and platinum. Embodiments can include allowing the seed metal layer to electrically couple a doped region on the semiconductor substrate 200 to the first metal layer 240. In an embodiment, a second metal layer is formed on the first metal layer 240, where the first metal layer 240 and seed metal layer electrically couples the second metal layer to a doped region on the semiconductor substrate 200.

Figure 11:
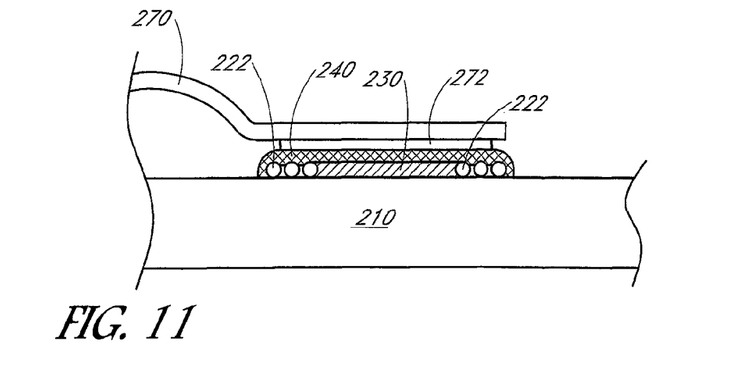

FIG. 11 illustrates soldering an interconnect tab to the formed contact region. The method further includes applying a solder paste 272 on the first metal layer 240. The method includes connecting an interconnect tab 270 to the first metal layer 240 through a soldering process, where the soldering process heats the solder paste 272 through the interconnect tab 270 to provide adhesion between the interconnect tab 270 and the first metal layer 240.

With reference to FIGS. 12-15 another method for forming a contact region for a semiconductor device is shown. In an embodiment, the semiconductor device 200 includes a semiconductor substrate 210. The method can include forming a seed metal layer on the semiconductor substrate 210. Embodiments can also include the semiconductor substrate 210 composed of a silicon substrate. In an embodiment, the seed metal layer is formed by a print deposition method, such as screen printing. The method can also include providing a seed metal layer composed of a layer of paste, the layer of paste having metal particles 122 and a filler medium 224.

Figure 12:
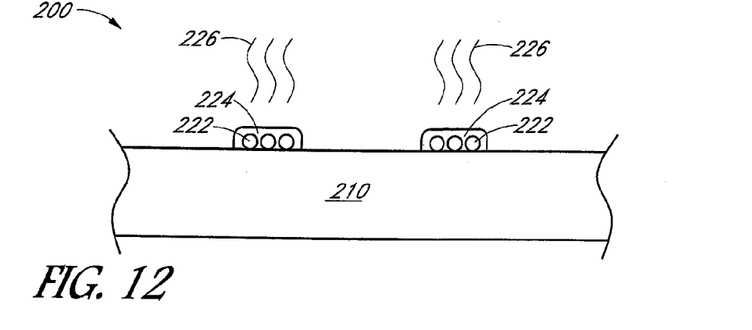
FIGS. 12-15 are cross-sectional representations of a semiconductor device being fabricated in accordance with another presented method for forming a contact region on a semiconductor device.

FIG. 12 illustrates a thermal cure process performed on the seed metal layer disposed on the semiconductor substrate. The metal particles 222 and filler medium 224 can be formed over the semiconductor substrate 210, where a thermal cure 226 can be performed on the seed metal layer. In an embodiment, the method can also include metal particles 222 selected from the group composed of aluminum micro-particles and aluminum nano-particles. In some embodiments, the seed metal layer can be composed of a material selected from the group composed of aluminum, aluminum paste or any applicable metal commonly used for coupling metal layers to doped regions of semiconductor devices. As discussed above, the thermal cure 226 can provide additional adhesion between the semiconductor substrate 210 and the seed metal layer. Embodiments can also include evaporating most of the filler medium 224 during thermal curing 226.

Figure 13:
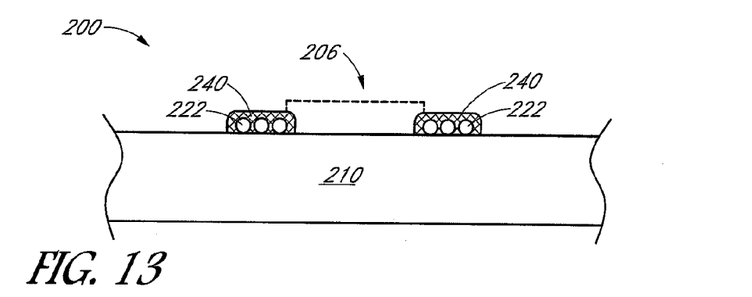

With reference to FIG. 13, forming a first metal layer on the seed metal layer is shown. In an embodiment, the method can include plating a first metal layer 240 on the seed metal layer. As discussed above the seed metal layer can be composed of metal particles 222. Embodiments can also include using electroless or electrolytic plating processes. In an embodiment, plating the first metal layer 240 can include plating metals selected from the group composed of copper, tin, aluminum, silver, gold, chromium, iron, nickel, zinc, ruthenium, palladium, and platinum. Embodiments can also include allowing the seed metal layer to electrically couple a doped region on the semiconductor substrate 200 to the first metal layer 240. In an embodiment, a second metal layer can be formed on the first metal layer 240, where the first metal layer 240 and seed metal layer electrically couples the second metal layer to a doped region on the semiconductor substrate 200. FIG. 13 shows the method can also include an exposed solder pad region 206.

Figure 14:
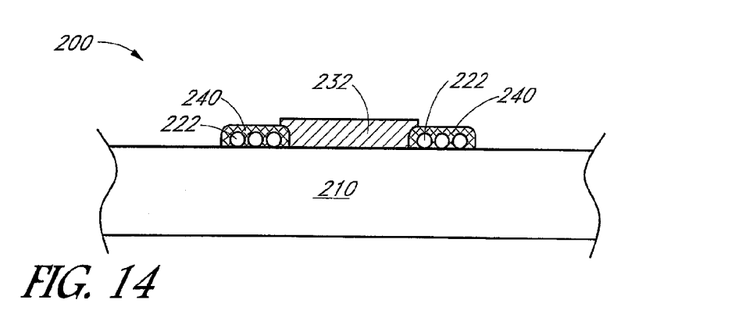

FIG. 14 illustrates forming a solderable material on the exposed solder pad region. The method can include forming a solderable material 232 on the exposed solder pad region 206 of FIG. 13 after forming the first metal layer 240. In an embodiment, the solderable material 232 is composed of a layer of silver paste. Embodiments can also include the solderable material 232 having a thickness, measured from the semiconductor substrate 200, in the range of 1-10 microns.

Figure 15:
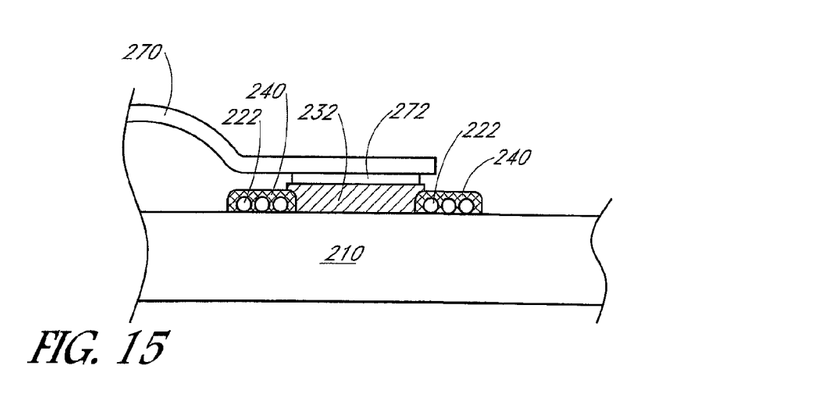

With reference to FIG. 15, there is shown soldering an interconnect tab to the formed contact region. The method can include applying a solder paste 272 on the solderable material 232. The method also includes connecting the interconnect tab 270 to the solderable material 232 through a soldering process, where the soldering process heats the solder paste 272 through the interconnect tab 270 to provide adhesion between the interconnect tab 270 and the solderable material 232.

With reference to FIGS. 16-19 another method for forming a contact region for a semiconductor device is shown. In an embodiment, the semiconductor device 200 includes a semiconductor substrate 210. The method can include forming a seed metal layer on the semiconductor substrate 210. In an embodiment, the seed metal layer can be formed by a print deposition method, such as screen printing. Embodiments can include the seed metal layer composed of a layer of paste, the layer of paste having metal particles 222 and a filler medium 224.

Figure 16:
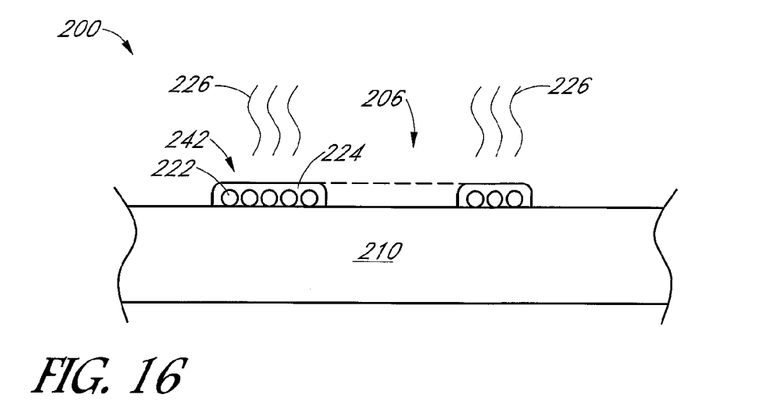
FIGS. 16-19 are cross-sectional representations of a semiconductor device being fabricated in accordance with still another presented method for forming a contact region on a semiconductor device.

FIG. 16 illustrates a thermal cure process performed on the seed metal layer disposed on the semiconductor substrate. The metal particles 222 and filler medium 224 are formed on the semiconductor substrate 210, where a thermal cure 226 is performed on the seed metal layer composed of the metal particles 222 and filler medium 224. The method can include forming a plating contact region 242 on the seed metal layer, where as discussed above the seed metal layer can be composed of metal particles 222. Embodiments can also include providing an exposed solder pad region 206. In an embodiment, the plating contact region 242 can be adjacent to the exposed solder pad region 232.

Figure 17:
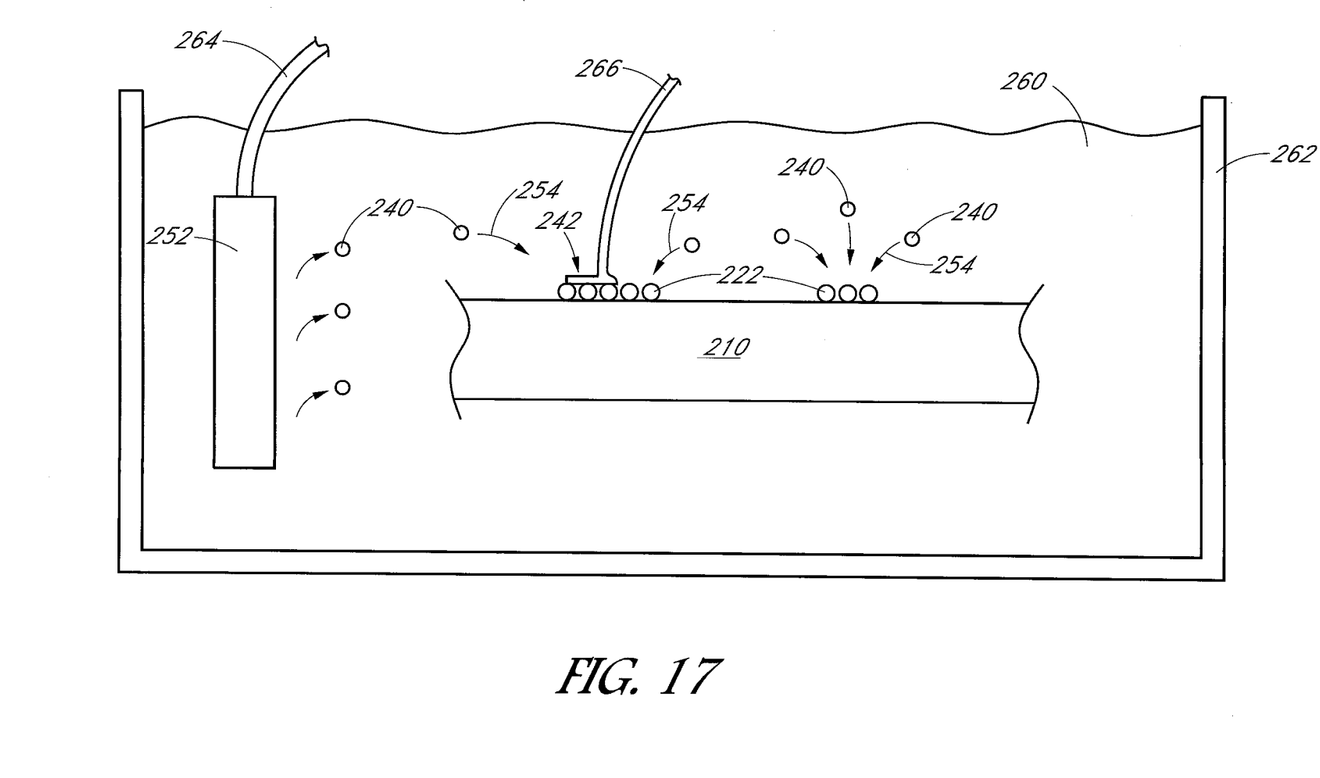

With reference to FIG. 17, plating a first metal layer on the seed metal layer is shown. The method can include providing a plating setup 250 including a plating medium 260 within a plating tank 262, a plating metal 252, and a first electrical connector 264 connected to the plating metal 252. The method can also include providing a second electrical connector 266 connected to the plating contact region 242 on the seed metal layer. The method can include inducing a reaction within the plating medium 260 to deposit a first metal 240, in a plating direction 254, on the seed metal layer, where the seed metal layer is composed of metal particles 222. In an embodiment, the reaction can be an electrical reaction carried out by conducting an electrical current through both the first and second electrical connectors 264 and 266 to allow the first metal 240 to plate to the seed metal layer. In an embodiment, the first metal 252 is selected from the group composed of nickel, gold, silver, rhodium, chromium, zinc, tin and cadmium. Embodiments can include a semiconductor device similar to the semiconductor device mentioned in the embodiments of FIGS. 12-15. In an embodiment, the method can include performing a plating process to form a second metal layer on the first metal layer. In an embodiment, the method can include electroless or electrolytic plating.

Figure 18:
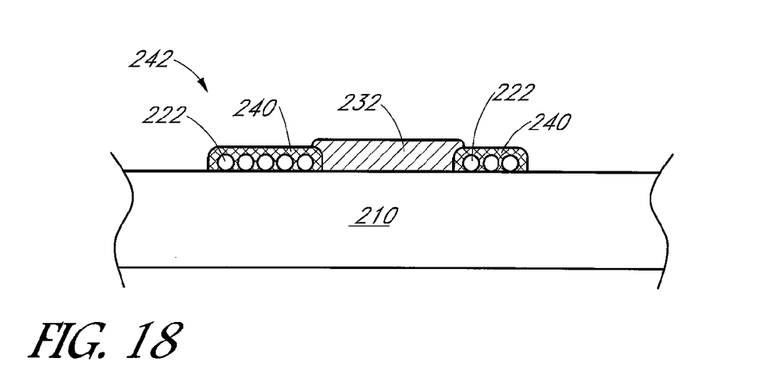

FIG. 18 illustrates forming a solderable material on the exposed solder pad region. The method includes forming a solderable material 232 on the exposed solder pad region 206 of FIG. 16 subsequent to forming first metal layer 240. In an embodiment, the solderable material 232 can be composed of a layer of silver paste. Embodiments can include providing a solderable material 232 having a thickness, measured from the semiconductor substrate 200 in the range of 1-10 microns. Embodiments can also include depositing the solderable material on the solder pad region of FIG. 16.

Figure 19:
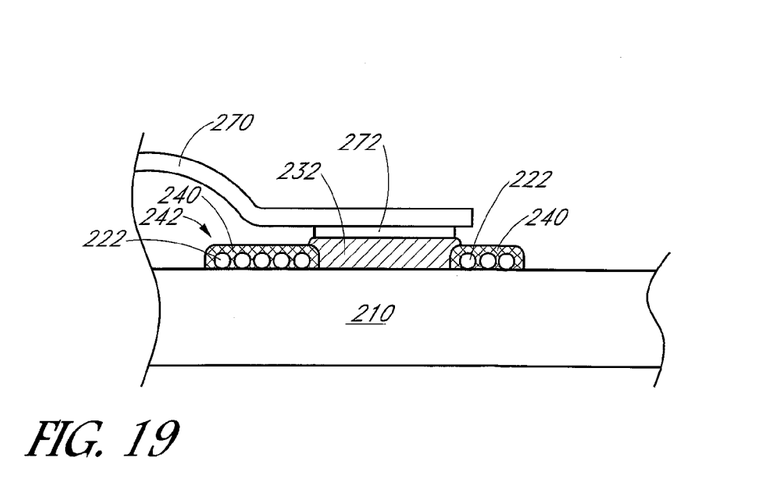

With reference to FIG. 19, a process for soldering an interconnect tab to the formed contact region is shown. The method can include applying a solder paste 272 on the solderable material 232. The method can include connecting the interconnect tab 270 to the solderable material 232 through a soldering process, where the soldering process heats the solder paste 272 through the interconnect tab 270 to provide adhesion between the interconnect tab 270 and the solderable material 232.

Figure 20:
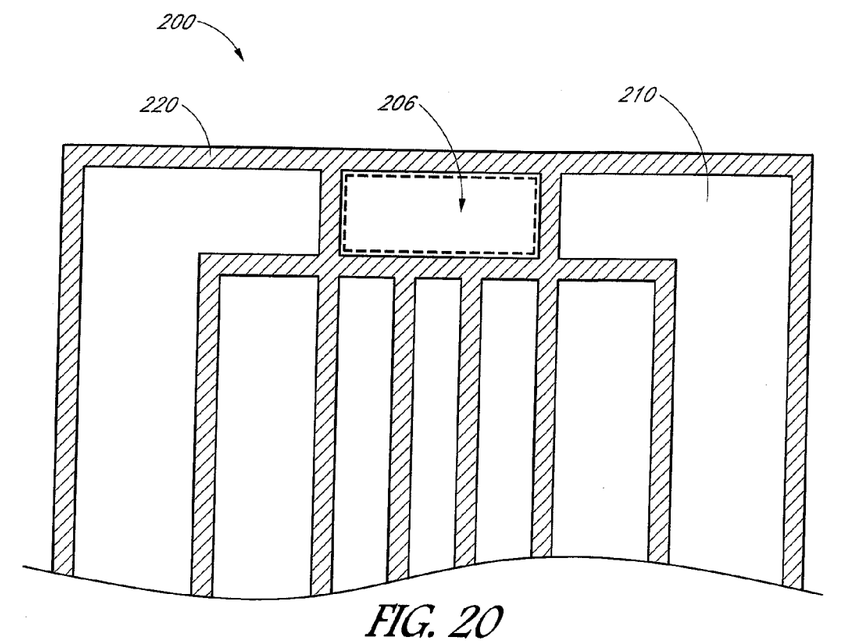
FIGS. 20 and 21 are schematic plan views of a semiconductor device being fabricated in accordance with a presented method for forming a contact region on a semiconductor device.

FIG. 20 illustrates a schematic plan view of an embodiment for the semiconductor device of FIGS. 8-15. The semiconductor device 200 of FIG. 20 can include a seed metal layer 220 having an exposed solder pad region 206. Embodiments can include, forming the seed metal layer 220 in an interdigitated pattern on a semiconductor substrate 210 as shown in FIG. 20. In an embodiment, the seed metal layer 220 can be formed around or within the periphery of the exposed solder pad region 206 such that gridlines or contact fingers of the seed metal layer 220 can be connected at the exposed solder pad region 206. In the embodiment where the seed metal layer can be connected at the exposed solder pad region 206, the shape of the connection area can be in a shape selected from the group composed of a rectangular shape as shown in FIG. 20, circular shape, oblong shape, square shape, triangular shape, trapezoid shape, polygon shape or any applicable shape that allows the contact fingers or gridlines to be connected at the exposed solder pad region 206. Embodiments can include forming the seed metal layer 220 in a dotted diffusion pattern. Embodiments can also include providing a seed metal layer 220 composed of metal particles, micro-particles, or nano-particles. In an embodiment, the seed metal layer 220 is composed of aluminum or an aluminum paste. Embodiments can also include forming a solderable material on the exposed solder pad region 206, where the solderable material allows for electrical conduction between a interconnect tab and the seed metal layer 220. In an embodiment, the solderable material is composed of a material selected from the group consisting of silver and a silver paste. Embodiments can include the solderable material following the shape of the exposed solder pad region 206. In an embodiment, a plurality of exposed solder pad regions can be formed, such as in pairs, which can be used for electrical conduction.

Figure 21:
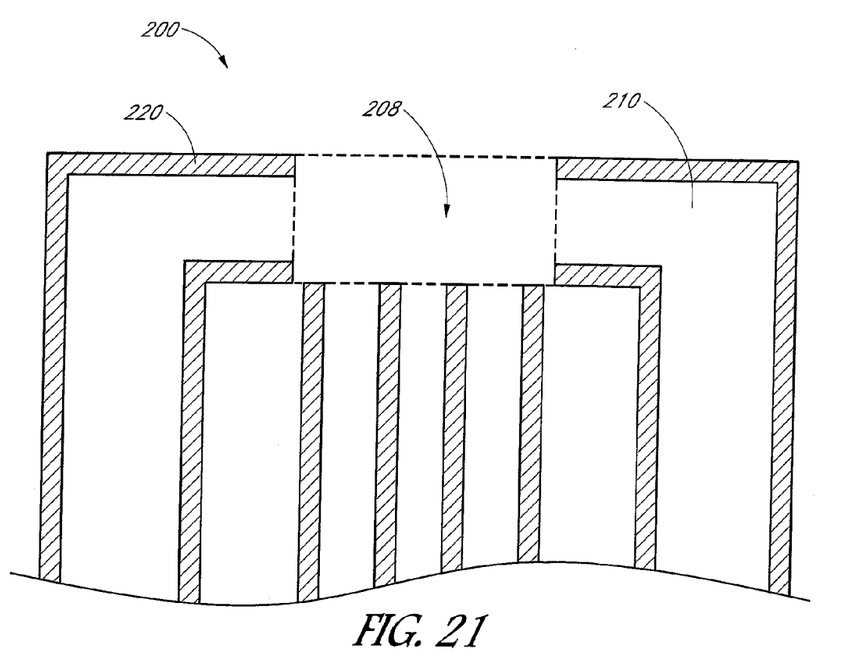

With reference to FIG. 21, a schematic plan view of another embodiment for the semiconductor device of FIGS. 8-15 is shown. The semiconductor device 200 of FIG. 21 can include a seed metal layer 220 having an exposed solder pad region 208. Embodiments can include, forming the seed metal layer 220 in an interdigitated pattern on a semiconductor substrate 210 as shown in FIG. 21. In an embodiment, the seed metal layer can be formed around or within the periphery of the exposed solder pad region 208 such that gridlines or contact fingers of the seed metal layer 220 are not connected at the exposed solder pad region 206 of FIG. 20, in contrast to FIG. 20. In the embodiment where the grid lines or contact fingers of the seed metal layer 220 are not connected at the exposed solder pad region 206, the shape of the exposed solder pad region 208 can be in a shape selected from the group composed of a rectangular shape as shown in FIG. 21, circular shape, oblong shape, square shape, triangular shape, trapezoid shape, polygon shape or any applicable shape that allows the contact fingers or gridlines to connect at the exposed solder pad region 208 once a solderable material is formed. Embodiments can include forming the seed metal layer 220 in a dotted diffusion pattern. Embodiments can also include providing a seed metal layer 220 composed of metal particles, micro-particles, or nano-particles. In an embodiment, the seed metal layer 220 is composed of aluminum or an aluminum paste. Embodiments can also include forming a solderable material on the exposed solder pad region 208, where the solderable material allows for electrical conduction between a interconnect tab and the seed metal layer 220. In an embodiment, the solderable material is composed of a material selected from the group composed of silver and a silver paste. Embodiments can also include the solderable material following the shape of the exposed solder pad region 208. In an embodiment, the solderable material 220 can act as an electrical bridge to connect individual contact fingers once formed at the exposed solder pad region 208. Also as stated earlier, a plurality of exposed solder pad regions can be formed, such as in pairs, which can be used for electrical conduction.

Figure 22:
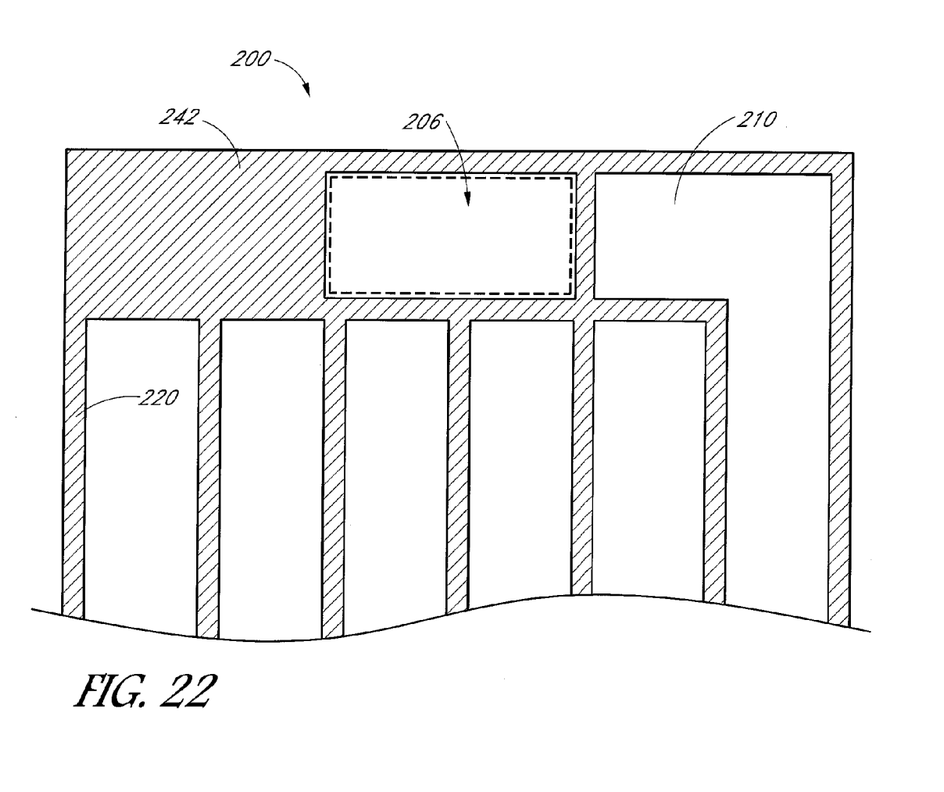
FIG. 22 is a schematic plan view of a semiconductor device being fabricated in accordance with another presented method for forming a contact region on a semiconductor device.

FIG. 22 illustrates a schematic plan view of still another embodiment for the semiconductor device of FIGS. 16-19. The semiconductor device 200 of FIG. 22 can include a seed metal layer 220 having an exposed solder pad region 206 and a plating contact region 242. Embodiments can include, forming the seed metal layer 220 in an interdigitated pattern on a semiconductor substrate 210 as shown in FIG. 22. In an embodiment, the seed metal layer 220 can be formed around or within the periphery of the exposed solder pad region 206 such that gridlines or contact fingers of the seed metal layer 220 can be connected at the exposed solder pad region 206. In the embodiment where the seed metal layer can be connected at the exposed solder pad region 206, a plating contact region 242 can be formed which can act as a point of connection used in a plating process, as shown in FIG. 17. In an embodiment, the shape of the exposed solder pad region 206 can be in a shape selected from the group composed of a rectangular shape as shown in FIG. 22, circular shape, oblong shape, square shape, triangular shape, trapezoid shape, polygon shape or any applicable shape that allows the contact fingers or gridlines to be connected at the exposed solder pad region 206.

Embodiments of the plating contact region can include, the plating contact region 242 can be in a shape selected from the group composed of a rectangular shape as shown in FIG. 22, circular shape, oblong shape, square shape, triangular shape, trapezoid shape, polygon shape or any applicable shape that allows for electrical conduction during a plating process. In an embodiment, the plating contact region 242 and the exposed solder pad region 206 can be adjacent. Embodiments can also include the plating contact region 242 and the exposed solder pad region 206 can be non-adjacent or in separate locations on the semiconductor device 200. Embodiments can also include forming the seed metal layer 220 in a dotted diffusion pattern. Embodiments can include providing a seed metal layer 220 composed of metal particles, micro-particles, or nano-particles. In an embodiment, the seed metal layer 220 is composed of aluminum or an aluminum paste. Embodiments can also include forming a solderable material on the exposed solder pad region 206, where the solderable material allows for electrical conduction between a interconnect tab and the seed metal layer 220. In an embodiment, the solderable material is composed of a material selected from the group composed of silver and a silver paste. Embodiments can include the solderable material following the shape of the exposed solder pad region 206. In an embodiment, a plurality of exposed solder pad regions can be formed, such as in pairs, which can be used for electrical conduction.

Figure 23:
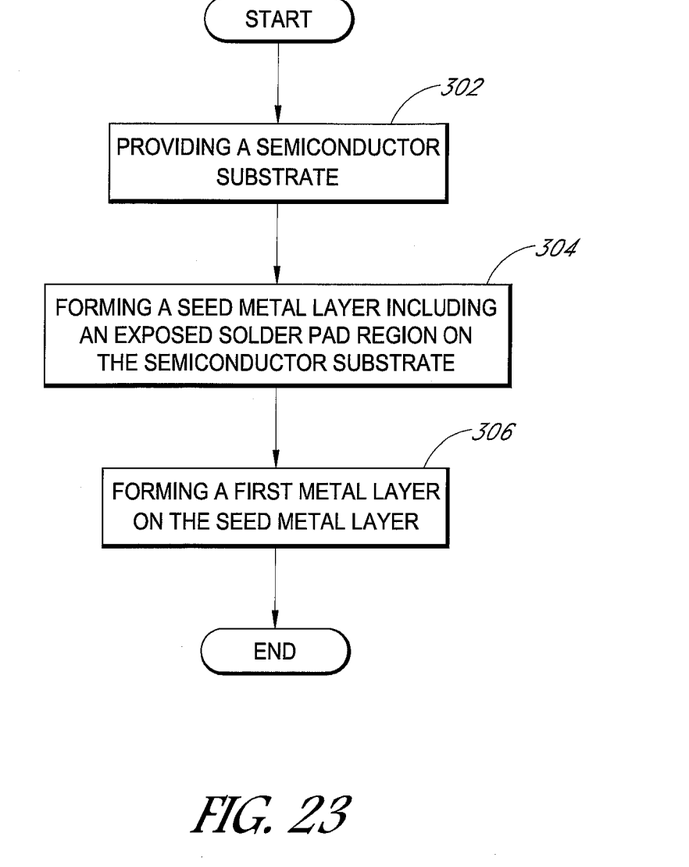
FIGS. 23-26 are flow chart representations of methods for forming contact region on semiconductor device in accordance with the presented methods for forming a contact region of on a semiconductor device.

FIG. 23 illustrates a flow chart of an embodiment for forming a contact region a on a semiconductor device. As described above, the first operation 302 can include providing a semiconductor substrate. A second operation 304 can include forming a seed metal layer including an exposed solder pad region on the semiconductor substrate. A last operation 306 can include forming a first metal layer on the seed metal layer.

Figure 24:
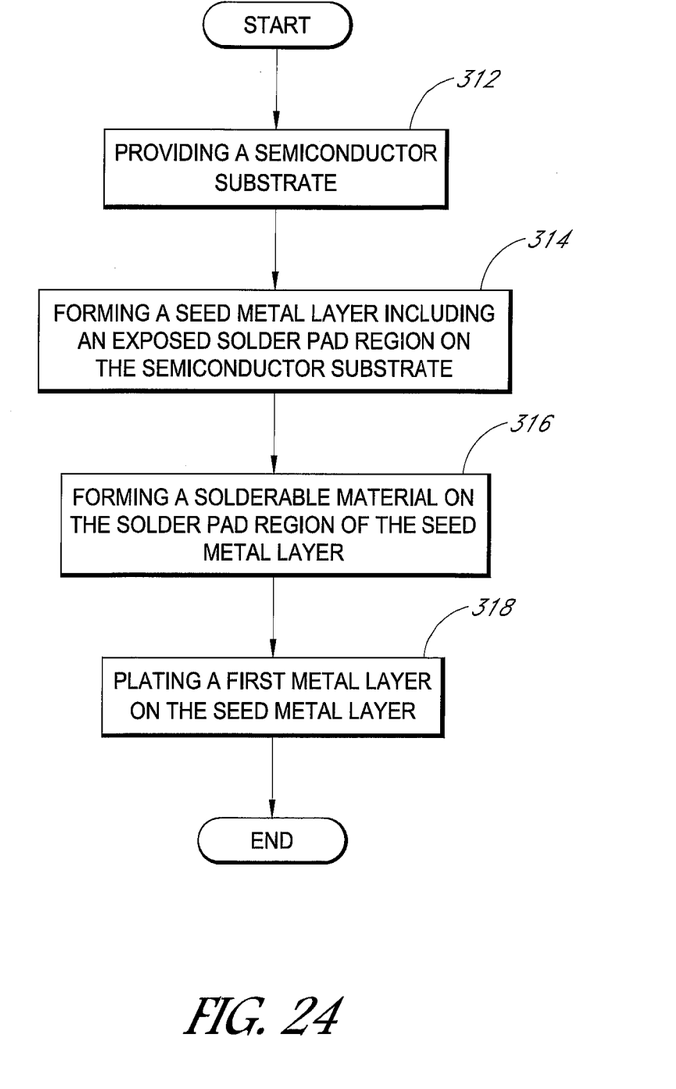

With reference to FIG. 24, a flow chart of another embodiment for forming a contact region a on a semiconductor device is shown. As described above, the first operation 312 can include providing a semiconductor substrate. A second operation 314 can include forming a seed metal layer including an exposed solder pad region on the semiconductor substrate. A third operation 316 can include forming a solderable material on the exposed solder pad region of the seed metal layer. A last operation 318 can include plating a first metal layer on the seed metal layer.

Figure 25:
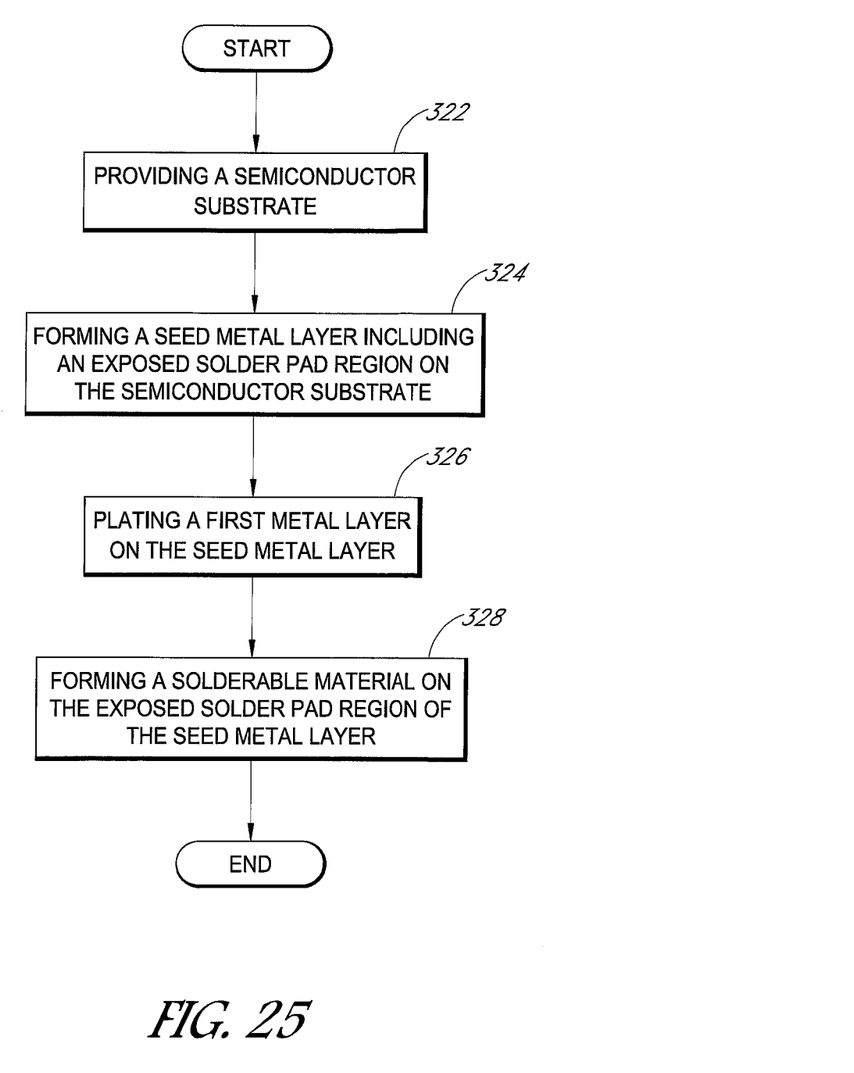

FIG. 25 illustrates a flow chart of still another embodiment for forming a contact region a on a semiconductor device. As described above, the first operation 322 can include providing a semiconductor substrate. A second operation 324 can include forming a seed metal layer including an exposed solder pad region on the semiconductor substrate. A third operation 326 can include plating a first metal layer on the seed metal layer. The last operation 328 can include subsequently forming a solderable material on the exposed solder pad region of the seed metal layer.

Figure 26:
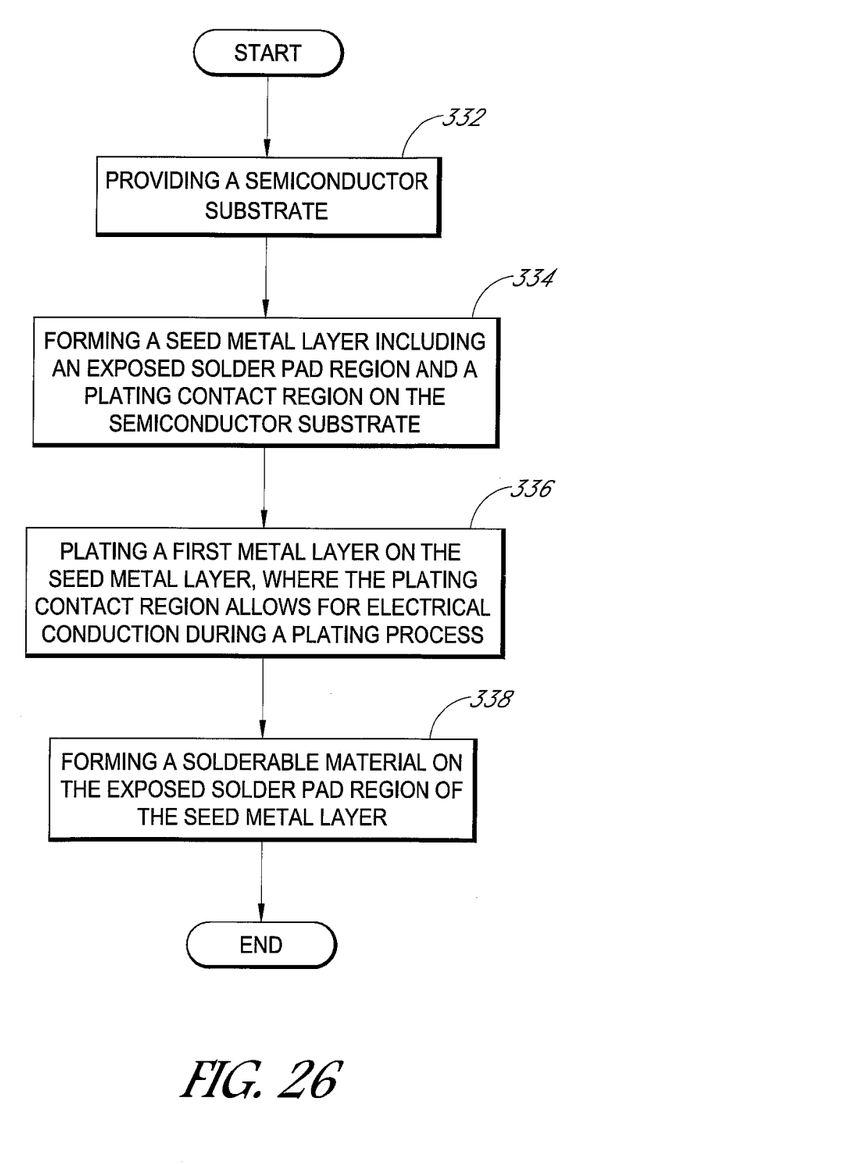

With reference to FIG. 26 a flow chart of yet another embodiment for forming a contact region on a semiconductor device is shown. As described above, the first operation 332 can include providing a semiconductor substrate. A second operation 334 can include forming a seed metal layer including an exposed solder pad region and a plating contact region on the semiconductor substrate. A third operation 336 can include plating a first metal layer on the seed metal layer, where the plating contact region allows for electrical conduction during a plating process. The last operation 338 can include forming a solderable material on the exposed solder pad region of the seed metal layer.

As mentioned above, the semiconductor device can include a solar cell, where the solar cell can include a silicon substrate. All processes mentioned above are applicable to the fabrication of solar cells and can be used as presented herein. In an embodiment, the solar cell can include a solar cell selected from the group composed of a back-contact solar cell, a front-contact solar cell, a monocrystalline silicon solar cell, a polycrystalline silicon solar cell, an amorphous silicon solar cell, a thin film silicon solar cell, a copper indium gallium selenide (CIGS) solar cell, and a cadmium telluride solar cell.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for forming a contact region for a semiconductor substrate, the method comprising:
    forming a seed metal layer comprising a first exposed solder pad region and a first plating contact region on the semiconductor substrate, wherein the first plating contact region allows for electrical conduction during a plating process;
    forming the seed metal layer comprising a second exposed solder pad region;
    forming a solderable material on the first exposed solder pad region; and
    forming a first metal layer on the seed metal layer.

2. The method of claim 1, wherein forming the first metal layer on the seed metal layer comprises plating a first metal layer on the seed metal layer.

3. The method of claim 1, wherein forming the solderable material on the first exposed solder pad region comprises forming the solderable material on the first exposed solder pad region before forming the first metal layer.

4. The method of claim 1, wherein forming the solderable material on the first exposed solder pad region comprises forming the solderable material on the first exposed solder pad region after forming the first metal layer.

5. The method of claim 1, wherein forming the seed metal layer comprises forming the seed metal layer from a material selected from a group consisting of an aluminum paste, a layer of aluminum, aluminum micro-particles and aluminum nano-particles.

6. The method of claim 1, further comprising forming the seed metal layer comprising a second plating contact region.

7. The method of claim 1, wherein the semiconductor substrate is a silicon substrate of a solar cell.

8. The method of claim 1, wherein forming the solderable material on the first exposed solder pad region comprises forming the solderable material having a thickness in a range of 1-10 microns.

9. The method of claim 1, wherein forming the solderable material on the first exposed solder pad region comprises forming a material selected from a group consisting of silver and a layer of silver.

10. A method for forming a contact region for a semiconductor substrate, the method comprising:
    forming a seed metal layer comprising a first exposed solder pad region and a first plating contact region on the semiconductor substrate, wherein the first plating contact region allows for electrical conduction during a plating process;
    forming the seed metal layer comprising a second plating contact region;
    forming a solderable material on the first exposed solder pad region; and
    forming a first metal layer on the seed metal layer.

11. The method of claim 10, wherein forming the first metal layer on the seed metal layer comprises plating the first metal layer on the seed metal layer.

12. The method of claim 10, wherein forming the solderable material on the first exposed solder pad region comprises forming the solderable material on the first exposed solder pad region before forming the first metal layer.

13. The method of claim 10, wherein forming the solderable material on the first exposed solder pad region comprises forming the solderable material on the first exposed solder pad region after forming the first metal layer.

14. The method of claim 10, wherein forming the seed metal layer comprises forming the seed metal layer from a material selected from a group consisting of an aluminum paste, a layer of aluminum, aluminum micro-particles and aluminum nano-particles.

15. The method of claim 10 further comprising forming the seed metal layer comprising a second exposed solder pad region.

16. The method of claim 10, wherein the semiconductor substrate comprises a silicon substrate of a solar cell.

17. The method of claim 10, wherein forming the solderable material on the first exposed solder pad region comprises forming the solderable material having a thickness in a range of 1-10 microns.

18. The method of claim 10, wherein forming the solderable material on the first exposed solder pad region comprises forming a material selected from a group consisting of silver and a layer of silver.

\* \* \* \* \*